United States Patent
Honda et al.

(10) Patent No.: US 11,410,785 B2
(45) Date of Patent: Aug. 9, 2022

(54) EXTREME ULTRAVIOLET LIGHT CONCENTRATING MIRROR AND ELECTRONIC DEVICE MANUFACTURING METHOD

(71) Applicant: Gigaphoton Inc., Tochigi (JP)

(72) Inventors: Yoshiyuki Honda, Oyama (JP);
Masayuki Morita, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/230,456

(22) Filed: Apr. 14, 2021

(65) Prior Publication Data
US 2021/0407700 A1 Dec. 30, 2021

(30) Foreign Application Priority Data

Jun. 29, 2020 (JP) .............................. JP2020-112007

(51) Int. Cl.
*G21K 1/06* (2006.01)
*H05G 2/00* (2006.01)
*G03F 7/20* (2006.01)

(52) U.S. Cl.
CPC .......... *G21K 1/062* (2013.01); *G03F 7/70033* (2013.01); *G03F 7/70316* (2013.01); *H05G 2/005* (2013.01); *H05G 2/008* (2013.01)

(58) Field of Classification Search
CPC ...... G02B 5/0891; G02B 1/18; G02B 5/0833; G21K 1/062; G03F 7/20; G03F 7/70033; G03F 1/24; G03F 1/52; G03F 1/58; G03F 7/70016; G03F 7/70175; G03F 7/70883; G03F 7/70908; G03F 7/70925; G03F 7/70958; G03F 7/70316; G03F 7/70916
See application file for complete search history.

(56) References Cited

U.S. PATENT DOCUMENTS

| 10,359,710 B2 | 7/2019 | Schimmel et al. |
| 2003/0180547 A1* | 9/2003 | Buhay ................. C03C 17/3613 428/434 |
| 2006/0175616 A1* | 8/2006 | Chandhok ................ G02B 1/14 257/79 |
| 2007/0178316 A1* | 8/2007 | Mellott .................. G02B 5/085 428/426 |

(Continued)

FOREIGN PATENT DOCUMENTS

| JP | 2008-288299 A | 11/2008 |
| WO | 2019/077734 A1 | 4/2019 |
| WO | 2019/077736 A1 | 4/2019 |

OTHER PUBLICATIONS

Journal of Sol,Gel Sci Technol 9, 85-93 (1997): "Sol-Gel derived TiO2•SiO2 Fibres"; Muralidharan, B.G., Agrawal, D. C.. ; https://doi.org/10.1007/BF02439339.

*Primary Examiner* — Michelle M Iacoletti
(74) *Attorney, Agent, or Firm* — Studebaker & Brackett PC

(57) ABSTRACT

An extreme ultraviolet light concentrating mirror may include a substrate, a multilayer reflection film provided on the substrate and configured to reflect extreme ultraviolet light, and a protective film provided on the multilayer reflection film. Here, the protective film may include a mixed film in which a network-forming oxide is mixed with an amorphous titanium oxide, or a mixed film in which two or more amorphous titanium oxide layers and two or more network-forming oxide layers are each alternately laminated.

15 Claims, 8 Drawing Sheets

(56) References Cited

U.S. PATENT DOCUMENTS

2019/0104604 A1* 4/2019 Chien .................... H05G 2/005
2020/0209444 A1  7/2020 Wakabayashi et al.
2020/0209759 A1  7/2020 Wakabayashi et al.

* cited by examiner

EXTREME ULTRAVIOLET LIGHT CONCENTRATING MIRROR AND ELECTRONIC DEVICE MANUFACTURING METHOD

CROSS-REFERENCE TO RELATED APPLICATIONS

The application claims the benefit of Japanese Unexamined Patent Application No. 2020-112007, filed on Jun. 29, 2020, the entire contents of which are hereby incorporated by reference.

BACKGROUND

1. Technical Field

The present disclosure relates to an extreme ultraviolet light concentrating mirror and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 20 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: U.S. Pat. No. 10,359,710
Patent Document 2: Japanese Unexamined Patent Application No. 2008-288299
Patent Document 3: International Publication No. WO2019/077736
Patent Document 4: International Publication No. WO2019/077734

Non-Patent Document

Non-patent Document 1: Muralidharan, B. G., Agrawal, D. C. Sol-Gel derived TiO2-SiO2 fibres. J Sol-Gel Sci Technol 9, 85-93 (1997). https://doi.org/10.1007/BF02439339

SUMMARY

An extreme ultraviolet light concentrating mirror according to an aspect of the present disclosure includes a substrate, a multilayer reflection film provided on the substrate and configured to reflect extreme ultraviolet light, and a protective film provided on the multilayer reflection film. Here, the protective film includes a mixed film in which a network-forming oxide is mixed with an amorphous titanium oxide.

An extreme ultraviolet light concentrating mirror according to an aspect of the present disclosure includes a substrate, a multilayer reflection film provided on the substrate and configured to reflect extreme ultraviolet light, and a protective film provided on the multilayer reflection film. Here, the protective film includes a multilayer film in which two or more amorphous titanium oxide layers and two or more network-forming oxide layers are each alternately laminated.

An electronic device manufacturing method according to an aspect of the present disclosure includes generating extreme ultraviolet light using an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a chamber having an internal space in which laser light is concentrated and a target substance is turned into plasma at a position where the laser light is concentrated, and an extreme ultraviolet light concentrating mirror configured to concentrate the extreme ultraviolet light radiated due to turning the target substance into plasma. The extreme ultraviolet light concentrating mirror includes a substrate, a multilayer reflection film provided on the substrate and configured to reflect the extreme ultraviolet light, and a protective film provided on the multilayer reflection film. The protective film includes a mixed film in which a network-forming oxide is mixed with an amorphous titanium oxide.

An electronic device manufacturing method according to an aspect of the present disclosure includes generating extreme ultraviolet light using an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a chamber having an internal space in which laser light is concentrated and a target substance is turned into plasma at a position where the laser light is concentrated, and an extreme ultraviolet light concentrating mirror configured to concentrate the extreme ultraviolet light radiated due to turning the target substance into plasma. The extreme ultraviolet light concentrating mirror includes a substrate, a multilayer reflection film provided on the substrate and configured to reflect the extreme ultraviolet light, and a protective film provided on the multilayer reflection film. The protective film includes a multilayer film in which two or more amorphous titanium oxide layers and two or more network-forming oxide layers are each alternately laminated.

BRIEF DESCRIPTION OF THE DRAWINGS

Embodiments of the present disclosure will be described below merely as examples with reference to the accompanying drawings.

DESCRIPTION OF EMBODIMENTS

Figure 1:
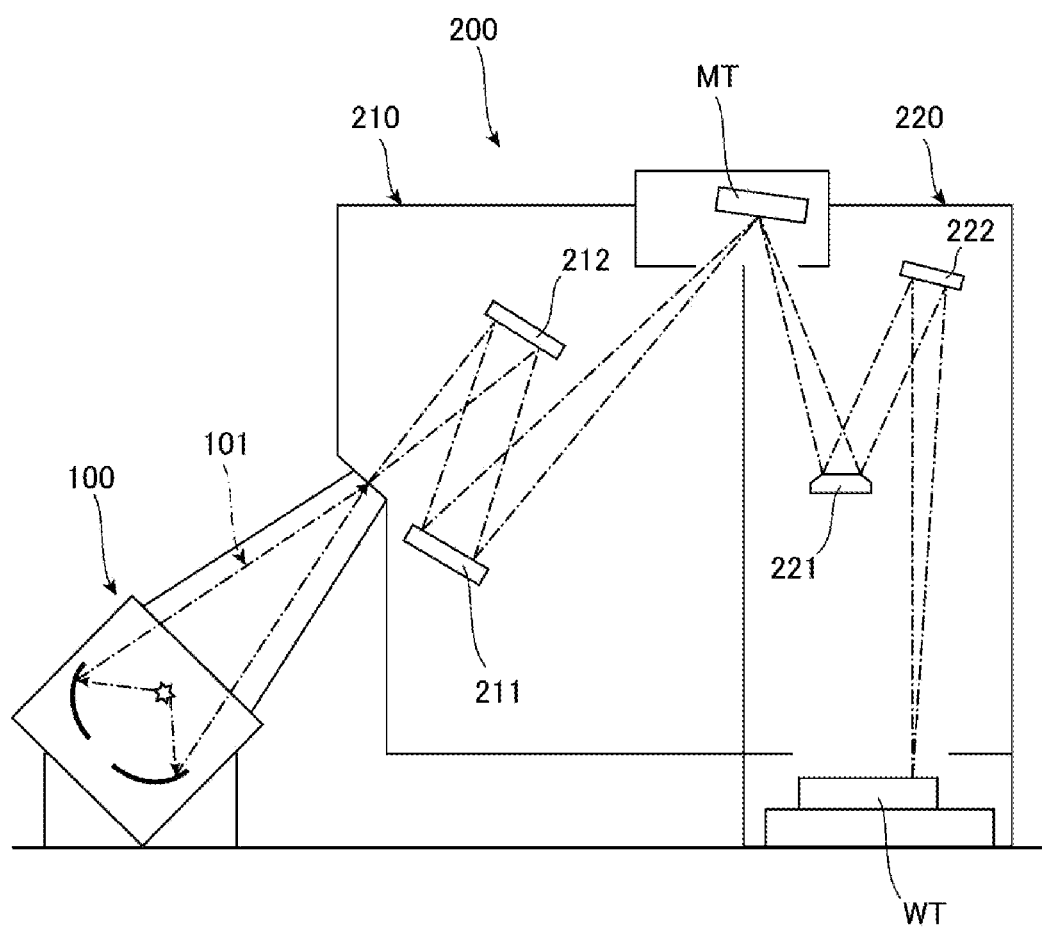
FIG. 1 is a schematic view illustrating an exemplary entire schematic configuration of an electronic device manufacturing apparatus.

1. Overview
2. Description of electronic device manufacturing apparatus
3. Description of extreme ultraviolet light generation apparatus
    3.1 Configuration
    3.2 Operation
4. Description of EUV light concentrating mirror of comparative example
    4.1 Configuration
    4.2 Problem
5. Description of EUV light concentrating mirror of first embodiment
    5.1 Configuration
    5.2 Effect
6. Description of EUV light concentrating mirror of second embodiment
    6.1 Configuration
    6.2 Effect Hereinafter, embodiments of the present disclosure will be described in detail with reference to the drawings. The embodiments described below illustrate some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light concentrating mirror used in an extreme ultraviolet light generation apparatus for generating light having wavelengths called extreme ultraviolet, and an electronic device manufacturing apparatus. In the following, extreme ultraviolet light is referred to as EUV light in some cases.

2. Description of Electronic Device Manufacturing Apparatus

FIG. 1 is a schematic view illustrating an electronic device manufacturing apparatus. As illustrated in FIG. 1, an electronic device manufacturing apparatus of the present example includes an EUV light generation apparatus 100 and an exposure apparatus 200. The exposure apparatus 200 includes a mask irradiation unit 210 including a plurality of mirrors 211, 212 and a workpiece irradiation unit 220 including a plurality of mirrors 221, 222. The mask irradiation unit 210 irradiates a mask pattern on a mask table MT through a reflection optical system with EUV light 101 incident from the EUV light generation apparatus 100. The workpiece irradiation unit 220 images the EUV light 101 reflected by the mask table MT onto a workpiece (not illustrated) disposed on the workpiece table WT through a reflection optical system. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
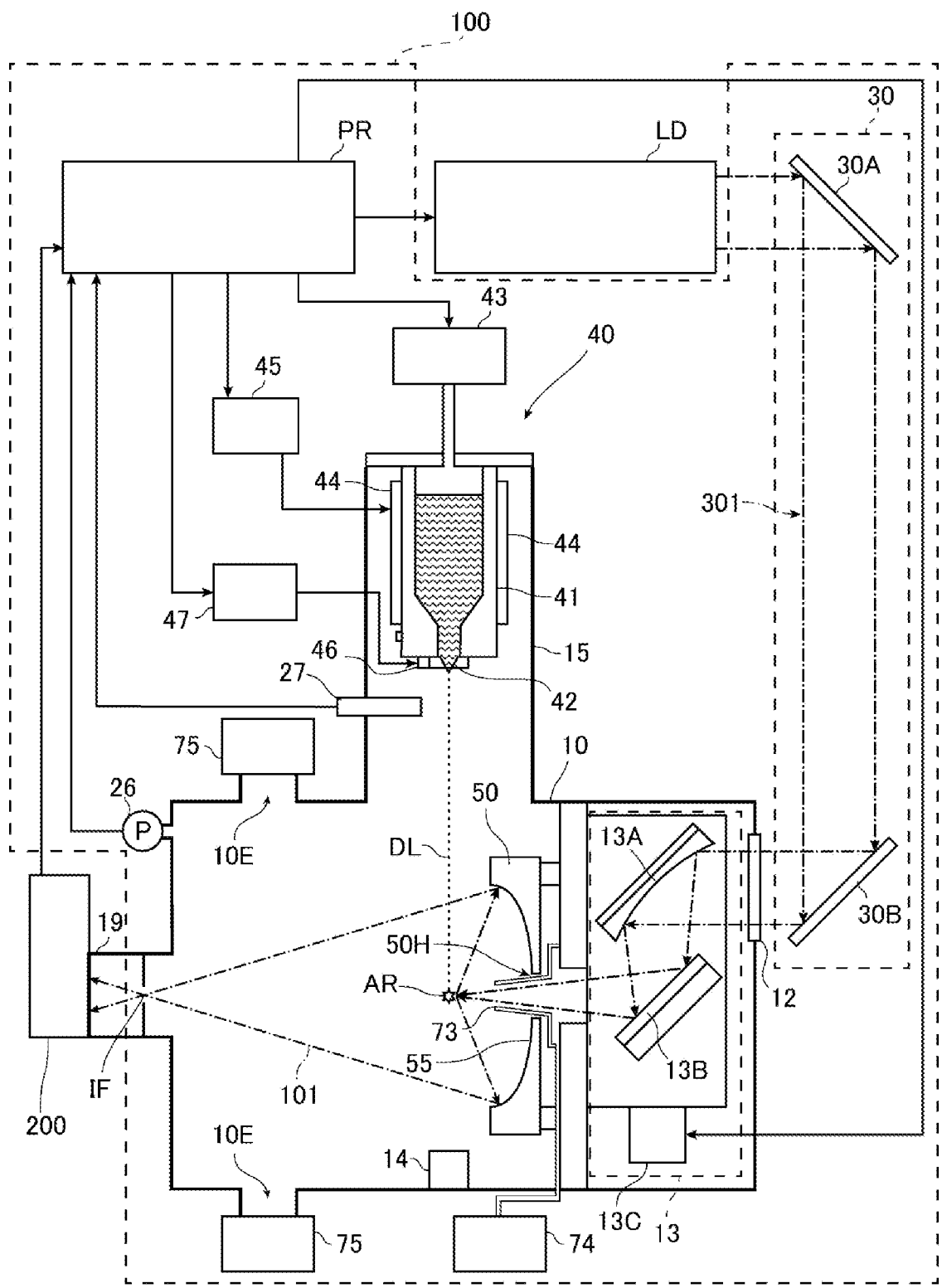
FIG. 2 is a schematic view illustrating an exemplary entire schematic configuration of an extreme ultraviolet light generation apparatus.

3. Description of Extreme Ultraviolet Light Generation Apparatus 3.1 Configuration An EUV light generation apparatus will be described. FIG. 2 is a schematic view illustrating an exemplary entire schematic configuration of the EUV light generation apparatus 100 of the present example. As illustrated in FIG. 2, a laser device LD is connected to the EUV light generation apparatus 100 of the present example. The EUV light generation apparatus 100 of the present example includes a chamber device 10, a processor PR, and a laser light delivery optical system 30 as a main configuration.

The chamber device 10 is a sealable container. The chamber device 10 includes a sub-chamber 15, and a target supply unit 40 is provided in the sub-chamber 15. The target supply unit 40 includes a tank 41 and a nozzle 42. The target supply unit 40 supplies a droplet DL to the internal space of the chamber device 10 and is attached, for example, to penetrate through a wall of the sub-chamber 15. The droplet DL, which is also called a target, is supplied from the target supply unit 40.

The tank 41 stores therein a target substance that becomes the droplet DL. The target substance contains tin. The inside of the tank 41 communicates, through a pipe, with a pressure adjuster 43 adjusting gas pressure. Further, a heater 44 is attached to the tank 41. The heater 44 heats the tank 41 with current applied from a heater power source 45. Through the heating, the target substance in the tank 41 melts.

The nozzle 42 is attached to the tank 41 and outputs the target substance. A piezoelectric element 46 is attached to the nozzle 42. The piezoelectric element 46 is electrically connected to a piezoelectric power source 47 and is driven by voltage applied from the piezoelectric power source 47. The target substance output from the nozzle 42 is formed into the droplet DL through operation of the piezoelectric element 46.

The chamber device 10 also includes a target collection unit 14. The target collection unit 14 collects unnecessary droplets DL.

At least one through hole is formed in a wall of the chamber device 10. The through hole is blocked by a window 12 through which pulsed laser light 301 emitted from the laser device LD passes.

Further, a laser light concentrating optical system 13 is located in the chamber device 10. The laser light concentrating optical system 13 includes a laser light concentrating mirror 13A and a high reflection mirror 13B. The laser light concentrating mirror 13A reflects and concentrates the laser light 301 passing through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a laser light concentrating position at the internal space of the chamber device 10 coincides with a position specified by the processor PR.

An EUV light concentrating mirror 50 having a substantially spheroidal reflection surface 55 is disposed inside the chamber device 10. The EUV light concentrating mirror 50 is a mirror that reflects EUV light and has a first focal point and a second focal point with respect to the EUV light. The EUV light concentrating mirror 50 is disposed such that, for example, the first focal point is located in the plasma generation region AR and the second focal point is located at an intermediate focal point IF. A through hole 50H is formed at a center of the EUV light concentrating mirror 50, and the laser light 301 passes through the through hole 50H.

Further, the EUV light generation apparatus 100 includes a connection portion 19 providing communication between the internal space of the chamber device 10 and an internal space of the exposure apparatus 200. A wall in which an aperture is formed is provided inside the connection portion 19. The wall is preferably disposed such that the aperture is located at the second focal point of the EUV light concentrating mirror 50.

Further, the EUV light generation apparatus 100 includes a pressure sensor 26. The pressure sensor 26 measures pressure in the internal space of the chamber device 10. Further, the EUV light generation apparatus 100 includes a target sensor 27 attached to the chamber device 10. The target sensor 27 has, for example, an imaging function, and detects the presence, trajectory, position, speed, and the like of the droplet DL.

The laser device LD includes a master oscillator being a light source to perform burst operation. The master oscillator emits the pulsed laser light 301 in a burst-on duration. The master oscillator is, for example, a CO2 laser device configured to emit the laser light having a wavelength of 10.6 μm by exciting, through electric discharge, gas as mixture of carbon dioxide gas with helium, nitrogen, and the like. The master oscillator may emit the pulsed laser light 301 by a Q switch system. The master oscillator may include an optical switch, a polarizer, and the like. In the burst operation, the pulsed laser light 301 is continuously emitted at a predetermined repetition frequency in the burst-on duration and the emission of the laser light 301 is stopped in a burst-off duration.

The travel direction of the laser light 301 emitted from the laser device LD is adjusted by the laser light delivery optical system 30. The laser light delivery optical system 30 includes a plurality of mirrors 30A and 30B for adjusting the travel direction of the laser light 301, and a position of at least one of the mirrors 30A and 30B is adjusted by an actuator (not illustrated). Owing to that the position of at least one of the mirrors 30A and 30B is adjusted, the laser light 301 can appropriately propagate into the chamber device 10 through the window 12.

The processor PR is a processing device including a storage device in which a control program is stored and a central processing unit (CPU) that executes the control program. The processor PR is specifically configured or programmed to perform various processes included in the present disclosure. In the present example, the processor PR is configured to control the entire EUV light generation apparatus 100, and also to control the laser device LD. The processor PR is electrically connected to the pressure adjuster 43, the heater power source 45, the piezoelectric power source 47, the pressure sensor 26, the target sensor 27, and the like. The processor PR receives a signal related to the pressure in the internal space of the chamber device 10, which is measured by the pressure sensor 26, a signal related to image data of the droplet DL captured by the target sensor 27, a burst signal from the exposure apparatus 200, and the like. The processor PR is configured to process the image data and the like, and to control, for example, timing at which the droplet DL is output, an output direction of the droplet DL, and the like. Such various kinds of control described above are merely exemplary, and other control may be added.

A gas supply unit 73 which supplies etching gas to an internal space of the chamber device 10 is disposed at the chamber device 10. The gas supply unit 73 is connected to a gas supply tank 74 which supplies the etching gas through a pipe. As described above, since the target substance contains tin, the etching gas is, for example, balance gas having a hydrogen gas concentration of about 3%. The balance gas may include nitrogen ($N_2$) gas or argon (Ar) gas. Here, a supply gas flow adjustment unit (not illustrated) may be disposed at the pipe between the gas supply unit 73 and the gas supply tank 74.

The gas supply unit 73 has a shape of a side surface of a circular truncated cone and is called a cone in some cases. A gas supply port of the gas supply unit 73 is inserted into the through hole 50H formed at the EUV light concentrating mirror 50, and the gas supply unit 73 supplies the etching gas from the through hole 50H in a direction away from the EUV light concentrating mirror 50. The laser light 301 passes through the through hole 50H of the EUV light concentrating mirror 50 through the gas supply unit 73, as described above. Therefore, the window 12 side of the gas supply unit 73 is configured so that the laser light 301 can be transmitted therethrough.

Tin fine particles and tin charged particles are generated when the target substance constituting the droplet DL is turned into plasma in the plasma generation region AR. The etching gas supplied from the gas supply unit 73 contains hydrogen that reacts with tin constituting the fine particles and charged particles. Through the reaction with hydrogen, tin becomes stannane ($SnH4$) gas at room temperature.

A pair of exhaust ports 10E are formed at the chamber device 10. The exhaust ports 10E are disposed, for example, at positions of the wall of the chamber device 10 as being opposed to each other. Residual gas contains tin fine particles and tin charged particles generated through the plasma generation from the target substance, stannane generated through the reaction of the tin fine particles and tin charged particles with the etching gas, and unreacted etching gas. Some of the charged particles are neutralized in the chamber device 10, and the residual gas contains the neutralized charged particles as well. The exhaust ports 10$h$ for exhausting the residual gas are connected to an exhaust pipe, and the exhaust pipe is connected to an exhaust device 75. Therefore, the residual gas exhausted from the exhaust port 10E flows into the exhaust device 75 through the exhaust pipe.

3.2 Operation

In the EUV light generation apparatus 100, for example, at the time of new installation, maintenance, or the like, atmospheric air in the chamber device 10 is exhausted. At this time, purge and exhaust may be repeated in the chamber device 10 to exhaust atmospheric components. For example, inert gas such as nitrogen or argon is preferably used for the purge gas. When the pressure in the chamber device 10 becomes equal to or less than a predetermined pressure after atmospheric air is exhausted, the processor PR starts introduction of the etching gas from the gas supply unit 73 into the chamber device 10. At this time, the processor PR may control a flow rate adjusting unit (not illustrated) while exhausting the gas in the internal space of the chamber device 10 from the exhaust port 10E to the exhaust device 75 so that the pressure in the internal space of the chamber device 10 is maintained at a predetermined pressure. The processor PR maintains the pressure in the internal space of the chamber device 10 substantially constant based on the signal of the pressure in the internal space of the chamber device 10 measured by the pressure sensor 26. At this time, the pressure in the internal space of the chamber device 10 is, for example, in the range of 10 Pa to 80 Pa.

For heating the target substance in the tank 41 to a predetermined temperature equal to or higher than the melting point, the processor PR causes the heater power source 45 to supply current to the heater 44. Thereafter, based on an output from a temperature sensor (not illustrated), an amount of the current supplied from the heater power source 45 to the heater 44 is adjusted to control the temperature of the target substance to a predetermined temperature. The predetermined temperature is, for example, in the range of 250° C. to 290° C. when tin is used as the target substance.

Further, the processor PR causes the pressure adjuster 43 to control the pressure in the tank 41 so that the melted target substance is output through a nozzle hole of the nozzle 42 at a predetermined speed. The target substance output through the hole of the nozzle 42 may be in the form of jet. At this time, the processor PR applies voltage having a predetermined waveform to the piezoelectric element 46 through the piezoelectric power source 47 to generate the droplet DL. Vibration of the piezoelectric element 46 can propagate via the nozzle 42 to the jet of the target substance to be output through the hole of the nozzle 42. The jet of the target substance is divided at a predetermined cycle by the vibration, and a liquid droplet DL is generated from the target substance.

Further, the processor PR outputs a light emission trigger to the laser device LD. When the light emission trigger is input, the laser device LD emits the pulsed laser light 301 having a wavelength of, for example, 10.6 μm. The emitted laser light 301 is incident on the laser light concentrating optical system 13 through the laser light delivery optical system 30 and the window 12. At this time, the processor PR controls the laser light manipulator 13C of the laser light concentrating optical system 13 such that the laser light 301 is concentrated in the plasma generation region AR. The processor PR causes the laser device LD to emit the laser light 301 based on the signal from the target sensor 27 so that the droplet DL is irradiated with the laser light 301. Thus, the droplet DL is irradiated in the plasma generation region AR with the laser light 301 concentrated by the laser light concentrating mirror 13A. Light including EUV light having a wavelength of 13.5 nm is emitted from the plasma generated through the irradiation.

Among the light including the EUV light generated in the plasma generation region AR, the EUV light 101 is concentrated at the intermediate focal point IF by being reflected by the EUV light concentrating mirror 50, and then, incident on the exposure apparatus 200. Here, some of the laser light 301 radiated to the droplet DL is reflected by the droplet DL and some part thereof is diffracted by the EUV light concentrating mirror 50, and propagation of the diffracted laser light 301 to the aperture is suppressed.

Further, when the target substance is turned into plasma, charged fine particles or electrically neutral fine particles are generated as described above. Some of the fine particles flows into the exhaust ports 10E. For example, a magnetic field generating unit (not illustrated) and the like may be provided to generate a magnetic field for converging the charged particles generated in the plasma generation region AR to the exhaust ports 10E. In this case, the charged fine particles are guided to the exhaust ports 10E while being converged in a spiral trajectory along the magnetic field line by receiving a Lorentz force from the magnetic field, and many of which flow into the exhaust ports 10E. Some other part of the fine particles diffused into the chamber device 10 adheres to the reflection surface 55 of the EUV light concentrating mirror 50. Some of the fine particles adhered to the reflection surface 55 reacts with the etching gas supplied from the gas supply unit 73, and the reaction produces a specific product. As described above, when tin is used as the target substance and gas containing hydrogen is used as the etching gas, the product is stannane ($SnH_4$) gas at room temperature. The product obtained through the reaction with the etching gas flows into the exhaust ports 10E along with the flow of the unreacted etching gas. The fine particles and the residual gas flowed into the exhaust port 10E are subjected to predetermined exhaust treatment such as detoxification at the exhaust device 75.

4. Description of EUV Light Concentrating Mirror of Comparative Example

Next, the EUV light concentrating mirror 50 of a comparative example of the EUV light generation apparatus 100 will be described. In the following description, any component same as that described above is denoted by an identical reference sign, and duplicate description thereof is omitted unless specific description is needed. The comparative example of the present disclosure is an example recognized by the applicant as known only by the applicant, and is not a publicly known example admitted by the applicant.

4.1 Configuration

Figure 3:
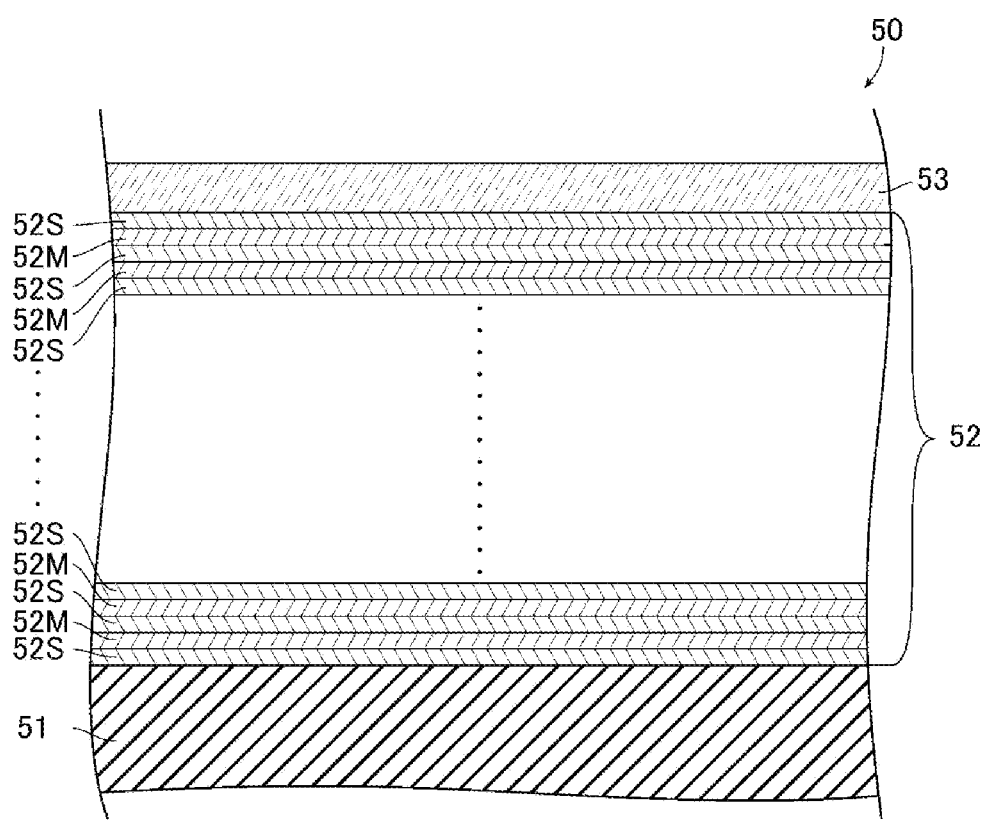
FIG. 3 is a sectional view of an EUV light concentrating mirror in a comparative example.

FIG. 3 is a sectional view of the EUV light concentrating mirror 50 of a comparative example. As illustrated in FIG. 3, the EUV light concentrating mirror 50 includes a substrate 51, a multilayer reflection film 52, and a protective film 53.

The substrate 51 has substantially the same shape as the EUV light concentrating mirror 50 illustrated in FIG. 2, and one surface thereof on the reflection surface 55 side is recessed in a substantially spheroidal shape. Specifically, the one surface has an elliptical surface shape in which the plasma generation region AR as a first focal point and the intermediate focal point IF as a second focal point at a position different from the first focal point are conjugate to each other.

The multilayer reflection film 52 is disposed on the one surface of the substrate 51. The multilayer reflection film 52 of the comparative example is formed by alternately laminating a silicon layer 52S and a molybdenum layer 52M. Here, a nickel-gold plating layer (not illustrated) may be provided on the one surface of the substrate 51, and the multilayer reflection film 52 may be provided on the nickel-gold plating layer. In the present example, the outermost layer of the multilayer reflection film 52 is a silicon layer 52S. The number of layers of the multilayer reflection film 52 is preferably, for example, 50 or more and 100 or less. For the EUV light 101 having a wavelength of 13.5 nm, the actual refractive index of the silicon layers 52S is 0.99, and the actual refractive index of the molybdenum layers 52M is 0.92. The layers used for the multilayer reflection film 52 may be layers other than layers of silicon and molybdenum. In this case, it is preferable that the actual refractive index of one of the above is 0.98 or more for light having a wavelength of 13.5 nm, and the actual refractive index of the other is 0.95 or less for light having a wavelength of 13.5 nm.

The protective film 53 is provided on the multilayer reflection film 52. Therefore, the outermost silicon layer 52S of the multilayer reflection film 52 is in contact with the protective film 53. The protective film 53 is formed of an amorphous titanium oxide. One surface of the protective film 53 is exposed to the internal space of the chamber device 10.

Among the fine particles generated during turning the droplet DL into plasma, the fine particles directed toward the surface of the protective film 53 in the EUV light concentrating mirror 50 react with the gas supplied from gas supply unit 73 to form a specific product, as described above. Although some of the fine particles adhere to the protective film 53, the titanium oxide forming the protective film 53 has excellent etching performance, and adhesion of tin to the protective film 53 is suppressed.

4.2 Problem

When the EUV light generation apparatus 100 is used, the temperature of the protective film 53 rises due to absorption of some part of the EUV light or light having other wavelengths radiated from the plasma generation region AR. When high speed tin ions emitted from the plasma generation region AR collide with the protective film 53 in a state that the temperature of the protective film 53 is risen, a titanium-tin alloy is generated at the protective film 53, and the titanium oxide may be crystallized. Further, when the protective film 53 having a risen temperature is exposed to stannane gas or hydrogen gas at high temperature and high concentration, the titanium oxide may be crystallized. In addition, in a state that the temperature of the protective film 53 is risen, the titanium oxide may be crystallized by hydrogen embrittlement caused by collision of hydrogen plasma and radicals generated in the vicinity of the surface of the protective film 53. In crystallization of the titanium oxide, first, crystal nuclei are generated, and the crystal nuclei are grown into large titanium oxide crystals. Thus, a large number of large titanium oxide crystals may be generated here and there by using the EUV light generation apparatus 100 for a long period of time. In this case, the generated titanium oxide crystals are a rutile type or an anatase type.

When the titanium oxide forming the protective film 53 is crystallized, the surface of the protective film 53 becomes rough, and EUV light is easily scattered on the surface of the protective film 53, which may cause deterioration of the reflection performance of the EUV light concentrating mirror 50. Further, when the titanium oxide is crystallized, density of the titanium oxide of the protective film 53 becomes uneven, the gas barrier performance of the protective film 53 is deteriorated, and hydrogen blister and the like may be generated between the protective film 53 and the multilayer reflection film 52. The hydrogen blister may deteriorate the multilayer reflection film 52, and may cause deterioration of the reflection performance of the EUV light concentrating mirror 50.

Therefore, in the following embodiments, the EUV light concentrating mirror 50 capable of suppressing decrease in reflectance of EUV light is exemplified.

5. Description of EUV Light Concentrating Mirror of First Embodiment

Next, a configuration of an EUV light concentrating mirror 50 of the first embodiment will be described. Any component same as that described above is denoted by an identical reference sign, and duplicate description thereof is omitted unless specific description is needed. In the following, description will be provided on an example in which tin is used as the target substance and the gas supplied from the gas supply unit 73 contains hydrogen.

5.1 Configuration

Figure 4:
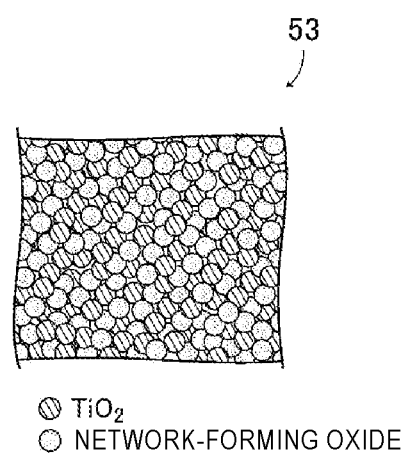
FIG. 4 is an enlarged view schematically illustrating a protective film in an EUV light concentrating mirror of a first embodiment.

FIG. 4 is an enlarged view schematically illustrating the protective film 53 of the EUV light concentrating mirror 50 of the present embodiment. As illustrated in FIG. 4, the EUV light concentrating mirror 50 of the present embodiment is the same as the EUV light concentrating mirror 50 of the comparative example in arrangement of the entire layers and the like, but differs from the EUV light concentrating mirror 50 of the comparative example in that the protective film 53 includes a mixed film in which a network-forming oxide is mixed with an amorphous titanium oxide.

Examples of the network-forming oxide include $SiO_2$, $B_2O_3$, $GeO_2$, $P_2O_5$, $As_2O_3$, $SbO_3$, $Bi_2O_3$, $P_2O_3$, $V_2O_5$, $Sb_2O_5$, $Cb_2O_5$, $SO_3$, and $ZrO_2$. The mixed film is formed by mixing at least one of the network-forming oxides with the titanium oxide. Specifically, $SiO_2$ has higher oxygen-block performance than other network-forming oxides. Therefore, it is preferable that the network-forming oxide to be mixed with the titanium oxide is $SiO_2$.

The thickness of the protective film 53 is preferably 2 nm or more and 20 nm or less. When the thickness of the protective film 53 is 2 nm or more, it is possible to suppress the tin fine particles and the like from reaching the multilayer reflection film 52, and it is also possible to suppress hydrogen from reaching the multilayer reflection film 52. When the thickness of the protective film 53 is 20 nm or less, it is possible to suppress an amount of EUV light absorbed by the protective film 53, and it is possible to suppress decrease in reflectance of the EUV light concentrating mirror 50.

Figure 5:
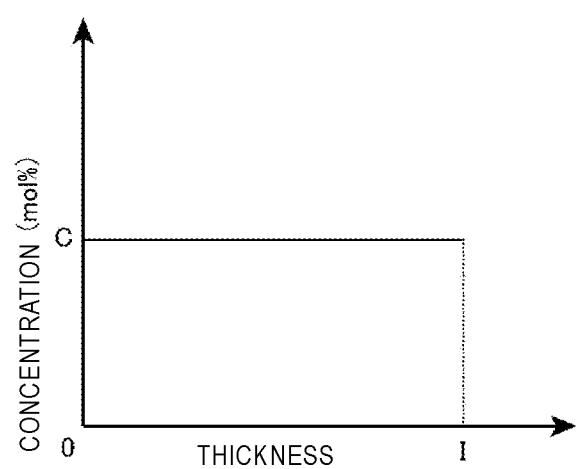
FIG. 5 is a graph showing an example of a concentration of a network-forming oxide in the thickness direction of the protective film.

FIG. 5 is a graph showing an example of a concentration of the network-forming oxide in the thickness direction of the protective film 53. In FIG. 5, the horizontal axis indicates the thickness of the protective film 53, where 0 indicates the position of the outer surface of the protective film 53, and I indicates the position of the interface between the protective film 53 and the multilayer reflection film 52. In the example shown in FIG. 5, the concentration of the network-forming oxide in the protective film 53 is constant in the thickness direction. Thus, in this example, the entire protective film 53 is formed of a mixed film. In FIG. 5, the concentration is indicated as C. In this case, the concentration of the network-forming oxide in the protective film 53 is preferably 1 mol % or more and 50 mol % or less. When the concentration of the network-forming oxide is 50 mol % or less, the etching performance for tin adhering to the protective film 53 can be sufficiently exhibited, and decrease in transmittance of EUV light of the protective film 53 can be suppressed. Here, when the network-forming oxide is $SiO_2$, the concentration is preferably 20 mol % or more and 50 mol % or less from a viewpoint of effectively suppressing crystallization of the titanium oxide.

Figure 6:
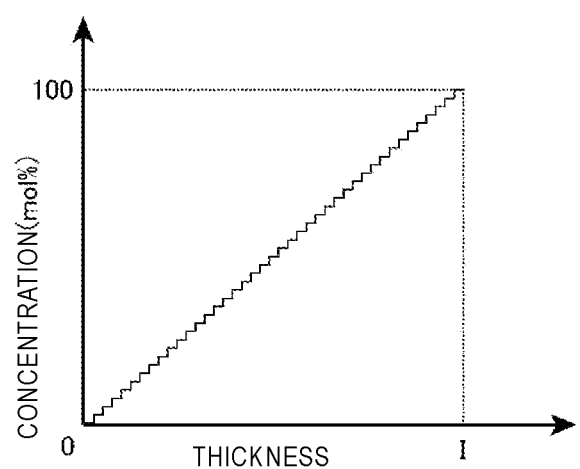
FIG. 6 is a graph showing another example of the concentration of the network-forming oxide in the thickness direction of the protective film of FIG. 4.

FIG. 6 is a graph showing another example of the concentration of the network-forming oxide in the thickness direction of the protective film 53 of FIG. 4 in the same manner as in FIG. 5. As shown in FIG. 6, in the present example, the concentration of the network-forming oxide in the protective film 53 is higher on the side of the multilayer reflection film 52 than on the outer surface side of the protective film 53. Specifically, on the outer surface of the protective film 53, the concentration of the titanium oxide is 100% without containing the network-forming oxide. The concentration of the network-forming oxide gradually increases from the outer surface side toward the multilayer reflection film 52 side, and the concentration of the network-forming oxide is 100% at the interface between the protective film 53 and the multilayer reflection film 52 without containing the titanium oxide. Accordingly, in the present example, the protective film 53 can be understood as the mixed film except for the outermost surface and the interface between the protective film 53 and the multilayer reflection film 52. When the concentration of the titanium oxide is 100% on the outer surface of the protective film 53, the etching performance for tin can be more effectively enhanced. Here, crystallization of the titanium oxide in the protective film 53 is likely to occur more on the multilayer reflection film 52 side than on the outer surface side of the protective film 53. Accordingly, the concentration of the network-forming oxide gradually increases from the outer surface side toward the multilayer reflection film 52 side, whereby crystallization of the titanium oxide can be suppressed more effectively. Further, crystallization of the titanium oxide tends to occur most frequently in the vicinity of the interface between the protective film 53 and the multilayer reflection film 52. Therefore, when the concentration of the network-forming oxide is 100% at the interface between the protective film 53 and the multilayer reflection film 52, crystallization of the titanium oxide can be more effectively suppressed. In the present example, when the concentration of the network-forming oxide in the protective film 53 is higher on the side to the multilayer reflection film 52 than on the outer surface side of the protective film 53, the network-forming oxide may be included at the outer surface of the protective film 53. Similarly, the titanium oxide may be included at the interface between the protective film 53 and the multilayer reflection film 52.

5.2 Effect

The protective film 53 of the present embodiment includes the mixed film in which the network-forming oxide is mixed with the amorphous titanium oxide. Owing to that the network-forming oxide is mixed with the titanium oxide, even when a crystal nucleus is generated in the titanium oxide, the crystal nucleus is surrounded by the network-forming oxide. Therefore, even when crystal nuclei of the titanium oxide are generated, contact between crystal nuclei can be suppressed. Further, mobility of titanium and oxygen ions can be suppressed by the network-forming oxide. Accordingly, it is possible to suppress growth of crystal nuclei of the titanium oxide. When the growth of the crystal nuclei of the titanium oxide is suppressed, generation and disappearance of the crystal nuclei are repeated. Therefore, by suppressing the growth of the crystal nuclei of the titanium oxide, increase of crystal nuclei can be suppressed, and appearance of grown crystal nuclei can be suppressed.

In the EUV light concentrating mirror 50 of the present embodiment, owing to that growth of crystal nuclei of the titanium oxide is expected to be suppressed, scattering of EUV light on the outer surface of the protective film 53 and deterioration of the gas-barrier performance of the protective film 53 are suppressed. Therefore, the EUV light concentrating mirror 50 of the present embodiment may suppress decrease in reflectance of EUV light.

6. Description of EUV Light Concentrating Mirror of Second Embodiment

Next, a configuration of an EUV light concentrating mirror 50 of a second embodiment will be described. Any component same as that described above is denoted by an identical reference sign, and duplicate description thereof is omitted unless specific description is needed.

6.1 Configuration

Figure 7:
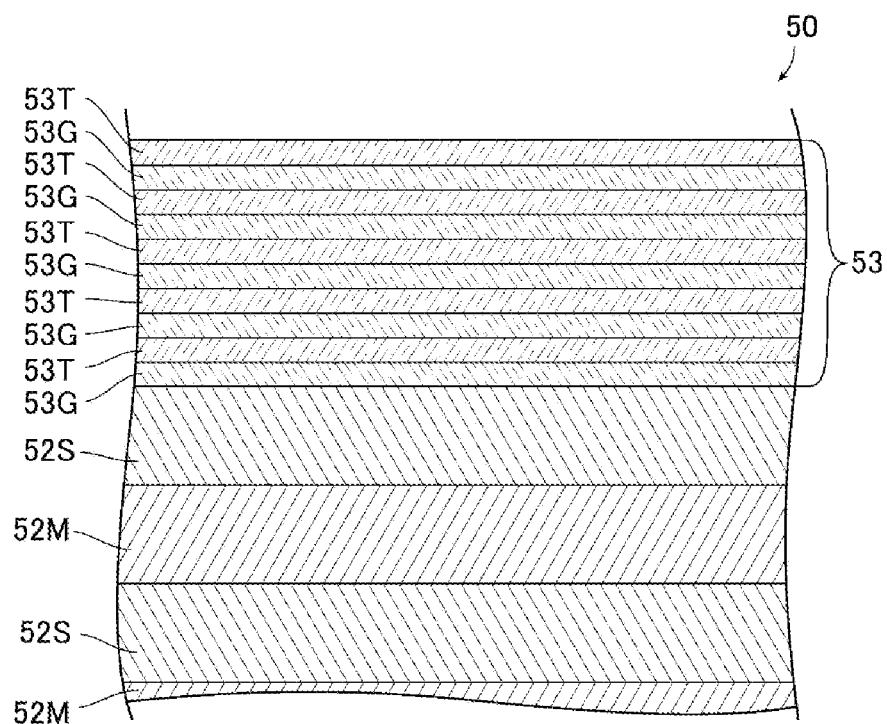
FIG. 7 is a schematic view illustrating a section of an example of the protective film in an EUV light concentrating mirror of a second embodiment.

FIG. 7 is a schematic view illustrating a section of an exemplary protective film 53 in the EUV light concentrating mirror 50 of the present embodiment. As illustrated in FIG. 7, the protective film 53 of the present embodiment differs from that of the EUV light concentrating mirror 50 of the comparative embodiment in including a multilayer film in which an amorphous titanium oxide layer 53T and a network-forming oxide layer 53G are alternately laminated. In the present embodiment, the entire protective film 53 is formed of the multilayer film. The number of layers of the protective film 53 is not limited to that shown in FIG. 7, and it is preferable that the number of the titanium oxide layers 53T and the number of the network-forming oxide layers 53G are each two or more and the sum of the titanium oxide layers 53T and the network-forming oxide layers 53G is 100 or less.

Examples of the network-forming oxide of the present embodiment are the same as those exemplified in the first embodiment. Each of the network-forming oxide layers 53G is formed of at least one of the above network-forming oxides. For example, two or more kinds of network-forming oxides may be contained in one network-forming oxide layer 53G, and the types of the network-forming oxide contained in two network-forming oxide layers 53G may be different from each other. It is preferable to use $SiO_2$ as the network-forming oxide forming the network-forming oxide layer 53G for the same reason as described in the first embodiment.

The thickness of the protective film 53 of the present embodiment is preferably similar to the thickness of the protective film 53 of the first embodiment for the same reason as described in the first embodiment.

In the present example, the thickness of the respective titanium oxide layers 53T is constant, and the thickness of the respective network-forming oxide layers 53G is constant. Further, the thickness of the respective titanium oxide layers 53T and the thickness of the respective network-forming oxide layers 53G are preferably 0.2 nm or more and 5 nm or less. Here, the sum of the thickness of the respective titanium oxide layers 53T and the thickness of the respective network-forming oxide layers 53G is equal to or less than the thickness of the protective film 53. Owing to that the thickness of each of the titanium oxide layers 53T and the thickness of each of the network-forming oxide layers 53G are 0.2 nm or more, contact between a pair of the network-forming oxide layers 53G sandwiching the titanium oxide layer 53T can be suppressed, and contact between a pair of the titanium oxide layers 53T sandwiching the network-forming oxide layer 53G can be suppressed. In particular, since contact between the pair of titanium oxide layers 53T sandwiching the network-forming oxide layer 53G can be suppressed, partial increase of the thickness of the titanium oxide layer 53T can be suppressed, and growth of the crystal nuclei of the titanium oxide layer 53T can be suppressed more effectively. Further, since the thickness of each of the titanium oxide layers 53T is 5 nm or less, even when a crystal nucleus is generated in the titanium oxide layer 53T, growth of the crystal nucleus can be suppressed more effectively.

Here, it is preferable that the sum of the thickness of the network-forming oxide layers 53G is not more than the sum of the thickness of the titanium oxide layers 53T. By forming each layer to have thickness as described above, it is possible to suppress decrease in transmittance of EUV light of the protective film 53.

In the present embodiment, the outermost layer of the protective film 53 is the titanium oxide layer 53T, the layer closest to the multilayer reflection film 52 is the network-forming oxide layer 53G, and this network-forming oxide layer 53G is provided on the multilayer reflection film 52. Since the outermost surface layer of the protective film 53 is the titanium oxide layer 53T, the etching performance for tin can be enhanced more effectively. As described in the first embodiment, crystallization of the titanium oxide tends to occur most frequently in the vicinity of the interface between the protective film 53 and the multilayer reflection film 52. Accordingly, owing to that the network-forming oxide layer 53G is provided on the multilayer reflection film 52, crystallization of the titanium oxide can be suppressed more effectively.

Figure 8:
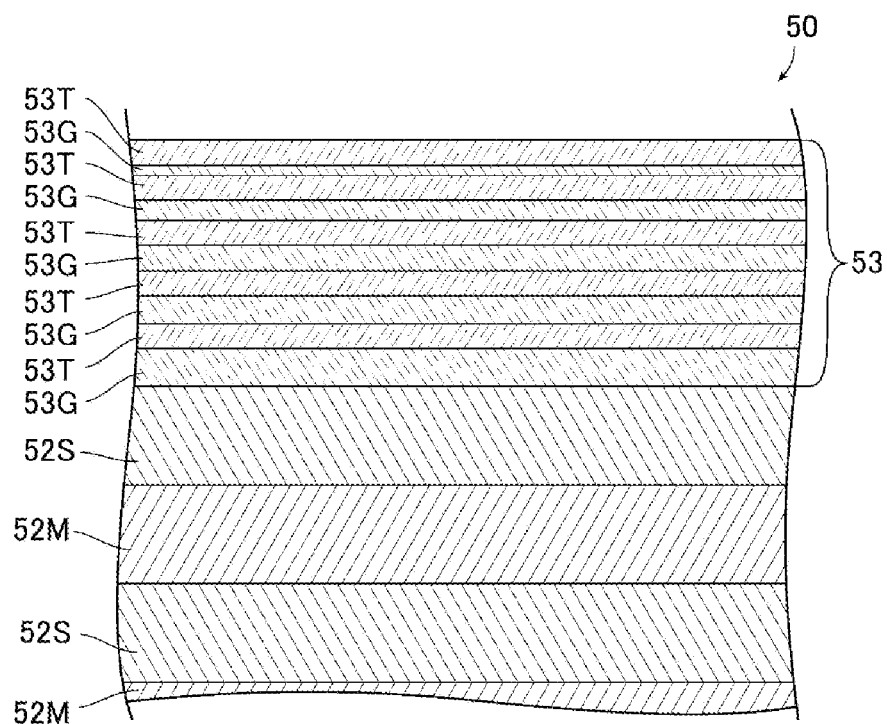
FIG. 8 is a schematic view illustrating a section of another example of the protective film in the EUV light concentrating mirror of a second embodiment.

FIG. 8 is a schematic view illustrating a section of another example of the protective film 53 in the EUV light concentrating mirror 50 of the present embodiment. Any component same as that described with reference to FIG. 7 is denoted by an identical reference sign, and duplicate description thereof is omitted unless specific description is needed. As illustrated in FIG. 8, in the present example, the thickness of each titanium oxide layer 53T is constant, and the thickness of each network-forming oxide layer 53G gradually increases from the outermost layer side toward the multilayer reflection film 52 side. Accordingly, in the protective film 53 of the present example, a thickness ratio of the thickness of each network-forming oxide layer 53G to the thickness of the titanium oxide layer 53T in contact with the network-forming oxide layer 53G on the outermost layer side is larger on the multilayer reflection film 52 side than on the outermost layer side. Here, crystallization of the titanium oxide in the protective film 53 is more likely to occur on the side to the multilayer reflection film 52 than on the outer surface side of the protective film 53. Accordingly, since the thickness ratio of the thickness of the network-forming oxide layer 53G to the thickness of the titanium oxide layer 53T on the multilayer reflection film 52 side is large, crystallization of the titanium oxide on the multilayer reflection film 52 side can be suppressed more effectively. Here, the thickness of each network-forming oxide layer 53G may be constant, and the thickness of each titanium oxide layer 53T may gradually decrease from the outermost layer side toward the multilayer reflection film 52 side. Even in such a configuration, the thickness ratio of the thickness of the network-forming oxide layer 53G to the thickness of the titanium oxide layer 53T becomes large on the multilayer reflection film 52 side. Although not particularly illustrated, in the present example, the thickness of each titanium oxide layer 53T may gradually decrease from the outermost layer side toward the multilayer reflection film 52 side with the configuration of each network-forming oxide layer 53G being similar to that described above.

The thickness ratio of the thickness of the network-forming oxide layer 53G to the thickness of the titanium oxide layer 53T described above preferably satisfies, for example, that "thickness of the network-forming oxide layer 53G"/"thickness of the titanium oxide layer 53T" is ½ or more and 1 or less on the outermost layer side, and 1 or more and 2 or less on the most multilayer reflection film 52 side.

Although not illustrated in particular, unlike the example of FIG. 8, the thickness of each titanium oxide layer 53T may gradually decrease from the outermost layer side toward the multilayer reflection film 52 side with the thickness of each network-forming oxide layer 53G being constant. Even in such a case, the thickness ratio of the thickness of each network-forming oxide layer 53G to the thickness of the titanium oxide layer 53T in contact with the network-forming oxide layer 53G on the outermost layer side is larger on the multilayer reflection film 52 side than on the outermost layer side.

6.2 Effect

The protective film 53 of the present embodiment includes a multilayer film in which two or more amorphous titanium oxide layers 53T and two or more network-forming oxide layers 53G are each alternately laminated. With such a configuration, even when crystal nuclei of the titanium oxide are generated, growth of the crystal nuclei in the thickness direction of the protective film 53 can be suppressed by the network-forming oxide layers 53G. Further, by suppressing the growth of the crystal nuclei of the titanium oxide, generation and disappearance of the crystal nuclei are repeated, excessive increase of the crystal nuclei can be suppressed, and increase of the amount of the crystal nuclei can be suppressed. In the EUV light concentrating mirror 50 of the present embodiment, owing to that growth of crystals of the titanium oxide is suppressed, scattering of EUV light on the outer surface of the protective film 53 and deterioration of the gas-barrier performance of the protective film 53 are suppressed. Therefore, the EUV light concentrating mirror 50 of the present embodiment may suppress decrease in reflectance of EUV light.

The description above is intended to be illustrative and the present disclosure is not limited thereto. Therefore, it would be obvious to those skilled in the art that various modifications to the embodiments and modified examples of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light concentrating mirror comprising:
   a substrate;
   a multilayer reflection film provided on the substrate and configured to reflect extreme ultraviolet light; and
   a protective film provided on the multilayer reflection film,
   the protective film including a mixed film in which a network-forming oxide is mixed with an amorphous titanium oxide,
   wherein the concentration of the network-forming oxide in the protective film is higher on the multilayer reflection film side than on an outer surface side of the protective film.

2. The extreme ultraviolet light concentrating mirror according to claim 1,
   wherein the network-forming oxide is at least one of $SiO_2$, $B_2O_3$, $GeO_2$, $P_2O_5$, $As_2O_3$, $SbO_3$, $Bi_2O_3$, $P_2O_3$, $V_2O_5$, $Sb_2O_5$, $Cb_2O_5$, $SO_3$, and $ZrO_2$.

3. The extreme ultraviolet light concentrating mirror according to claim 1,
   wherein thickness of the protective film is in the range of 2 nm to 20 nm.

4. An extreme ultraviolet light concentrating mirror comprising:
   a substrate;
   a multilayer reflection film provided on the substrate and configured to reflect extreme ultraviolet light; and
   a protective film provided on the multilayer reflection film, the protective film including a multilayer film in which two or more amorphous titanium oxide layers and two or more network-forming oxide layers are each alternately laminated.

5. The extreme ultraviolet light concentrating mirror according to claim 4,
wherein the extreme ultraviolet light is radiated from tin irradiated with laser light.

6. The extreme ultraviolet light concentrating mirror according to claim 5,
wherein the tin is irradiated with the laser light in a hydrogen-atmosphere chamber, and
the extreme ultraviolet light reaches the multilayer reflection film through the protective film in the chamber.

7. The extreme ultraviolet light concentrating mirror according to claim 4,
wherein a network-forming oxide in the network-forming oxide layer is at least one of $SiO_2$, $B_2O_3$, $GeO_2$, $P_2O_5$, $As_2O_3$, $SbO_3$, $Bi_2O_3$, $P_2O_3$, $V_2O_5$, $Sb_2O_5$, $Cb_2O_5$, $SO_3$, and $ZrO_2$.

8. The extreme ultraviolet light concentrating mirror according to claim 4,
wherein thickness of the protective film is 2 nm or more and 20 nm or less.

9. The extreme ultraviolet light concentrating mirror according to claim 8,
wherein thickness of each layer of the titanium oxide layers and the network-forming oxide layers is in the range 0.2 nm to 5 nm.

10. The extreme ultraviolet light concentrating mirror according to claim 4,
wherein the network-forming oxide layer is provided on the multilayer reflection film.

11. The extreme ultraviolet light concentrating mirror according to claim 4,
wherein an outermost surface layer of the protective film is the titanium oxide layer.

12. The extreme ultraviolet light concentrating mirror according to claim 11,
wherein a thickness ratio of thickness of each network-forming oxide layer to thickness of the titanium oxide layer in contact with the network-forming oxide layer on the outermost layer side is larger on the multilayer reflection film side than on the outermost layer side.

13. The extreme ultraviolet light concentrating mirror according to claim 12,
wherein thickness of the network-forming oxide layer is larger on the multilayer reflection film side than on the outermost surface side.

14. An electronic device manufacturing method, comprising:
generating extreme ultraviolet light using an extreme ultraviolet light generation apparatus;
emitting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a chamber having an internal space in which laser light is concentrated and a target substance is turned into plasma at a position where the laser light is concentrated; and
an extreme ultraviolet light concentrating mirror configured to concentrate the extreme ultraviolet light radiated due to turning the target substance into plasma, and
the extreme ultraviolet light concentrating mirror including:
a substrate;
a multilayer reflection film provided on the substrate and configured to reflect the extreme ultraviolet light; and
a protective film provided on the multilayer reflection film,
the protective film including a mixed film in which a network-forming oxide is mixed with an amorphous titanium oxide,
wherein the concentration of the network-forming oxide in the protective film is higher on the multilayer reflection film side than on an outer surface side of the protective film.

15. An electronic device manufacturing method, comprising:
generating extreme ultraviolet light using an extreme ultraviolet light generation apparatus;
emitting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a chamber having an internal space in which laser light is concentrated and a target substance is turned into plasma at a position where the laser light is concentrated; and
an extreme ultraviolet light concentrating mirror configured to concentrate the extreme ultraviolet light radiated due to turning the target substance into plasma, and
the extreme ultraviolet light concentrating mirror including:
a substrate;
a multilayer reflection film provided on the substrate and configured to reflect the extreme ultraviolet light; and
a protective film provided on the multilayer reflection film,
the protective film including a multilayer film in which two or more amorphous titanium oxide layers and two or more network-forming oxide layers are each alternately laminated.

* * * * *